(12) United States Patent
Tanwani et al.

(10) Patent No.: US 11,835,556 B2
(45) Date of Patent: *Dec. 5, 2023

(54) METER FOR USE WITH A DISTRIBUTED ENERGY RESOURCE DEVICE

(71) Applicant: Landis+Gyr Innovations, Inc., Alpharetta, GA (US)

(72) Inventors: Nikhil Tanwani, Delhi (IN); Bahadur Singh Rathore, Noida (IN); Matt Karlgaard, Brainerd, MN (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/558,466

(22) Filed: Dec. 21, 2021

(65) Prior Publication Data

US 2022/0113339 A1  Apr. 14, 2022

Related U.S. Application Data

(63) Continuation of application No. 17/038,930, filed on Sep. 30, 2020, now Pat. No. 11,237,194.

(Continued)

(51) Int. Cl.
*G01R 22/06* (2006.01)
*G01R 11/04* (2006.01)
(Continued)

(52) U.S. Cl.
CPC ............ *G01R 22/065* (2013.01); *G01R 11/04* (2013.01); *G01R 22/068* (2013.01); *H01R 13/113* (2013.01); *H02H 1/0007* (2013.01)

(58) Field of Classification Search
CPC .... G01R 22/065; G01R 11/04; G01R 22/068; H01R 13/113; H02H 1/0007; H02J 7/34
See application file for complete search history.

(56) References Cited

U.S. PATENT DOCUMENTS 4,463,311 A   7/1984  Kobayashi
4,977,482 A   12/1990 Langdon et al.
(Continued)

FOREIGN PATENT DOCUMENTS

CN   1403825    3/2003
CN   201467023  5/2010
(Continued)

OTHER PUBLICATIONS

U.S. Appl. No. 17/158,406, Notice of Allowance dated Apr. 19, 2022, 8 pages.

(Continued)

*Primary Examiner* — Christopher P McAndrew
*Assistant Examiner* — Zannatul Ferdous
(74) *Attorney, Agent, or Firm* — Kilpatrick Townsend & Stockton LLP

(57) ABSTRACT

An electric meter includes a housing, a first set of connection paths, and a second set of connection paths. The first set of connection paths couple to a meter socket and are electrically coupled to a first electrical connection path between first phases of an electric distribution power source, a distributed energy resource device, and a load. First electrical metrology components of the first electrical connection path are positioned within a first segment of the housing. The second set of connection paths couple to a meter socket and are electrically coupled to a second electrical connection path between second phases of the electric distribution power source, the distributed energy resource device, and the load. Second electrical metrology components of the second electrical connection path are positioned within a second segment of the housing that is non-overlapping with the first segment of the housing.

8 Claims, 14 Drawing Sheets

Related U.S. Application Data

(60) Provisional application No. 62/914,205, filed on Oct. 11, 2019.

(51) Int. Cl.
  *H01R 13/11* (2006.01)
  *H02H 1/00* (2006.01)

(56) References Cited

U.S. PATENT DOCUMENTS

| | | |
|---|---|---|
| 5,515,119 A | 5/1996 | Murdock et al. |
| 5,572,396 A | 11/1996 | Robinson |
| 6,011,640 A | 1/2000 | Hutton |
| 6,188,145 B1 | 2/2001 | Stewart |
| 6,420,801 B1 | 7/2002 | Seefeldt |
| 6,874,893 B2 | 4/2005 | Park |
| 6,879,451 B1 | 4/2005 | Hewlett et al. |
| 7,182,632 B1 | 2/2007 | Johnson, Jr. et al. |
| 7,274,305 B1 | 9/2007 | Luttrell |
| 7,298,134 B2 | 11/2007 | Weikel et al. |
| 7,648,389 B1 | 1/2010 | Scott et al. |
| 8,049,642 B2 | 11/2011 | Makinson et al. |
| 8,207,865 B2 | 6/2012 | Kopp et al. |
| 8,212,687 B2 | 7/2012 | Makinson et al. |
| 8,784,130 B2 | 7/2014 | Scott et al. |
| 9,088,182 B2 | 7/2015 | Kuniyosi et al. |
| 9,318,861 B2 | 4/2016 | Fulton et al. |
| 9,391,414 B2 | 7/2016 | Seals |
| 9,437,986 B2 | 9/2016 | Knauer et al. |
| 9,484,653 B1 | 11/2016 | Chen |
| 9,500,672 B1 | 11/2016 | Bautista et al. |
| 9,595,815 B2 | 3/2017 | Knauer et al. |
| 9,620,305 B2 | 4/2017 | Miller et al. |
| 9,627,861 B2 | 4/2017 | Cruz |
| 9,960,637 B2 | 5/2018 | Sanders et al. |
| 9,995,768 B2 | 6/2018 | Parks et al. |
| 10,132,838 B2 | 11/2018 | Parks et al. |
| 10,886,748 B1 | 1/2021 | Karlgaard et al. |
| 11,237,194 B2 * | 2/2022 | Tanwani ............ G01R 22/068 |
| 2002/0075622 A1 | 6/2002 | Robinson |
| 2002/0171436 A1 | 11/2002 | Russell |
| 2003/0011910 A1 | 1/2003 | Weiss |
| 2003/0034693 A1 | 2/2003 | Wareham et al. |
| 2004/0036362 A1 | 2/2004 | Beck et al. |
| 2005/0027464 A1 | 2/2005 | Jonker et al. |
| 2006/0007686 A1 | 1/2006 | Hough |
| 2008/0091625 A1 | 4/2008 | Kremen |
| 2008/0266133 A1 | 10/2008 | Martin |
| 2009/0121705 A1 | 5/2009 | Rzehak |
| 2010/0003848 A1 | 1/2010 | Scott et al. |
| 2010/0105226 A1 | 4/2010 | Gong et al. |
| 2010/0225305 A1 | 9/2010 | Reineccius |
| 2010/0306027 A1 | 12/2010 | Haugh |
| 2012/0278016 A1 | 11/2012 | Huff et al. |
| 2013/0106397 A1 | 5/2013 | Fulton et al. |
| 2013/0123997 A1 | 5/2013 | King et al. |
| 2013/0211754 A1 | 8/2013 | Herzog et al. |
| 2013/0226485 A1 | 8/2013 | Pietrowicz et al. |
| 2014/0127935 A1 | 5/2014 | Scott et al. |
| 2014/0218010 A1 | 8/2014 | Fulton et al. |
| 2015/0061644 A1 | 3/2015 | Parks et al. |
| 2015/0233980 A1 | 8/2015 | Umetsu et al. |
| 2015/0285844 A1 | 10/2015 | May |
| 2015/0309075 A1 | 10/2015 | Parks et al. |
| 2016/0056571 A1 * | 2/2016 | Hamaoka ............ H01R 13/7033 439/638 |
| 2016/0061870 A1 | 3/2016 | Vaculik et al. |
| 2016/0131688 A1 | 5/2016 | Carlson |
| 2016/0141784 A1 * | 5/2016 | Hashiguchi ............ H01R 24/50 439/733.1 |
| 2016/0181752 A1 | 6/2016 | Parks et al. |
| 2016/0181807 A1 | 6/2016 | Day et al. |
| 2016/0320427 A1 | 11/2016 | Bautista et al. |
| 2016/0380413 A1 | 12/2016 | Cruz |
| 2017/0168516 A1 | 6/2017 | King |
| 2017/0194792 A1 | 7/2017 | Zimmanck et al. |
| 2017/0212160 A1 | 7/2017 | Fulton et al. |
| 2017/0214225 A1 | 7/2017 | Ramachandran et al. |
| 2017/0229827 A1 * | 8/2017 | Michelmann ......... H01R 31/06 |
| 2017/0346296 A1 | 11/2017 | Schamber et al. |
| 2018/0083446 A1 | 3/2018 | Kern |
| 2018/0109047 A1 | 4/2018 | Hoang et al. |
| 2018/0246150 A1 | 8/2018 | Cook |
| 2019/0140455 A1 | 5/2019 | Wong et al. |
| 2020/0225263 A1 * | 7/2020 | Karlgaard ............ G01R 1/0416 |
| 2020/0412129 A1 | 12/2020 | Schamber et al. |
| 2021/0109142 A1 | 4/2021 | Karlgaard et al. |

FOREIGN PATENT DOCUMENTS

| | | |
|---|---|---|
| CN | 201623651 | 11/2010 |
| CN | 101976854 | 2/2011 |
| CN | 202110217 | 1/2012 |
| CN | 102882237 | 1/2013 |
| CN | 103138291 | 6/2013 |
| CN | 103187735 | 7/2013 |
| CN | 203368046 | 12/2013 |
| CN | 103545926 | 1/2014 |
| CN | 105242087 | 1/2016 |
| CN | 103645363 | 9/2016 |
| FR | 3002642 | 8/2014 |
| JP | 06153527 | 5/1994 |
| JP | 2001090296 | 4/2001 |
| JP | 2008283764 | 11/2008 |
| JP | 2010283936 | 12/2010 |
| JP | 2011204045 | 10/2011 |
| JP | 2012228043 | 11/2012 |
| JP | 2012244665 | 12/2012 |
| JP | 2014230454 | 12/2014 |
| JP | 2015156728 | 8/2015 |
| WO | 03014748 | 2/2003 |
| WO | 2003014748 | 3/2003 |
| WO | 2011124657 | 10/2011 |
| WO | 2013057516 | 12/2013 |
| WO | 2014002798 | 1/2014 |
| WO | 2014192015 | 12/2014 |
| WO | 2016167722 | 10/2016 |

OTHER PUBLICATIONS

U.S. Appl. No. 17/158,508, Notice of Allowance dated Apr. 18, 2022, 9 pages.
Australian Application No. 2017271591, Notice of Acceptance dated Mar. 23, 2021, 3 pages.
International Application No. PCT/US2020/054422, International Preliminary Report on Patentability dated Apr. 21, 2022, 8 pages.
International Application No. PCT/US2020/053512, International Preliminary Report on Patentability dated Apr. 21, 2022, 7 pages.
Canada Application No. 3,024,185, Notice of Allowance dated Jul. 20, 2022, 1 page.
Australia Application No. 2021204455, First Examination Report dated Aug. 22, 2022, 2 pages.
Japanese Application No. 2022-046586, Office Action dated Aug. 2, 2022, 4 pages (2 pages of Original Document and 2 pages of English Translation).
"Conzerv EM6438_EM6436 Dual Source Energy Meters User Manual", available online at https://download.schneider-electric.com/files7p_enDocType=User+guide&p_File_Name=NHA12537-03.pdf&p%20Doc%20Ref=NHA12537, Dec. 31, 2015, 76 pages.
Milbank Manufacturing, "Recreational Vehicle Park", Product Sheet available at https://www.milbankworks.com/getmedia/24191e24-6c65-4ffb-a468-9c98e6ec8f68/Recreational-Vehicle-Park-Electrical-Products.pdf at least as early as Apr. 2019, 32 pages.
U.S. Appl. No. 17/038,930, Non-Final Office Action dated Jun. 7, 2021, 21 pages.
U.S. Appl. No. 17/038,930, Notice of Allowance dated Sep. 24, 2021, 9 pages.

(56) References Cited

OTHER PUBLICATIONS

International Patent Application No. PCT/US2020/053512, International Search Report and Written Opinion dated Jan. 19, 2021, 10 pages.

* cited by examiner

METER FOR USE WITH A DISTRIBUTED ENERGY RESOURCE DEVICE

CROSS-REFERENCE TO RELATED APPLICATIONS

This is a continuation of U.S. patent application Ser. No. 17/038,930, filed Sep. 30, 2020, and titled "METER FOR USE WITH A DISTRIBUTED ENERGY RESOURCE DEVICE," which claims benefit of and priority to U.S. Provisional Application No. 62/914,205, filed Oct. 11, 2019, and titled "METER AND SOCKET FOR USE WITH A DISTRIBUTED ENERGY RESOURCE DEVICE," the entire contents of which are hereby incorporated by this reference.

TECHNICAL FIELD

This disclosure relates generally to an electric meter. More particularly, this disclosure relates to an electric meter for use with a distributed energy resource device.

BACKGROUND

Distributed energy resource (DER) devices, for example, solar panels, wind turbines, electric vehicle batteries, etc. are typically wired into the grid with a connection into a circuit breaker in an electrical panel within a customer's premises. If metering of the DER device is required, a separate meter is typically mounted on the customer's wall for this purpose. One or more disconnect switches are typically also mounted on the customer's wall.

There is an increase in the use of DER devices by energy consumers, including residential consumers. Currently, when a consumer wants to connect a DER device at a premises, a utility and an electrician installing the DER device must coordinate and be on the premises at the same time. The utility disconnects the power to the meter socket. After the power is disconnected, the electrician connects the DER device "behind the meter." In some installations, a separate meter for the DER device may be required. After the DER device is installed, the utility re-connects the power to the meter socket. A system for connecting a DER device to an existing utility service without coordination between the utility and the electrician is desirable.

SUMMARY

Systems for connecting distributed energy resource devices with distributed energy resource meters are provided.

According to various aspects of the present disclosure, an electric meter includes a housing, a first set of connection paths, and a second set of connection paths. The first set of connection paths couple to a meter socket and are electrically coupled to a first electrical connection path between first phases of an electric distribution power source, a distributed energy resource device, and a load. First electrical metrology components of the first electrical connection path are positioned within a first segment of the housing. The second set of connection paths couple to a meter socket and are electrically coupled to a second electrical connection path between second phases of the electric distribution power source, the distributed energy resource device, and the load. Second electrical metrology components of the second electrical connection path are positioned within a second segment of the housing that is non-overlapping with the first segment of the housing.

In another example, a system includes an electric meter socket and an electric meter that mates with the electric meter socket. The electric meter includes a housing, a first set of connection paths, and a second set of connection paths. The first set of connection paths couple to a meter socket and are electrically coupled to a first electrical connection path between first phases of an electric distribution power source, a distributed energy resource device, and a load. First electrical metrology components of the first electrical connection path are positioned within a first segment of the housing. The second set of connection paths couple to a meter socket and are electrically coupled to a second electrical connection path between second phases of the electric distribution power source, the distributed energy resource device, and the load. Second electrical metrology components of the second electrical connection path are positioned within a second segment of the housing that is non-overlapping with the first segment of the housing.

In another example, a system for metering a distributed energy resource device includes an electric meter and an electric meter socket the electrically couples to the electric meter. The electric meter includes a housing, a first set of connection paths, and a second set of connection paths. The first set of connection paths couple to a meter socket and are electrically coupled to a first electrical connection path between first phases of an electric distribution power source, a distributed energy resource device, and a load. First electrical metrology components of the first electrical connection path are positioned within a first segment of the housing. The second set of connection paths couple to a meter socket and are electrically coupled to a second electrical connection path between second phases of the electric distribution power source, the distributed energy resource device, and the load. Second electrical metrology components of the second electrical connection path are positioned within a second segment of the housing that is non-overlapping with the first segment of the housing. The electric meter socket includes a first line connection path and a second line connection path within the electric meter socket that form a first line electrical connection and a second line electrical between the electric meter and line voltage wirings of the electric distribution power source. The electric meter socket also includes a first distributed energy resource connection path and a second distributed energy resource connection path within the electric meter socket that form a first distributed energy resource electrical connection and a second distributed energy resource electrical connection between the electric meter and distributed energy resource voltage wirings of the distributed energy resource device. Further, the electric meter socket includes a first load connection path and a second load connection path within the electric meter socket that form a first load electrical connection and a second load electrical connection between the electric meter and the load. Furthermore, the electric meter socket includes at least one neutral connection path within the electric meter socket that forms a neutral electrical connection between the electric meter and neutral wires of the electric distribution power source, the distributed energy resource device, and the load.

These illustrative aspects and features are mentioned not to limit or define the presently described subject matter, but to provide examples to aid understanding of the concepts described in this application. Other aspects, advantages, and features of the presently described subject matter will become apparent after review of the entire application.

BRIEF DESCRIPTION OF THE DRAWINGS

Aspects and features of the various embodiments will be more apparent by describing examples with reference to the accompanying drawings, in which.

DETAILED DESCRIPTION

While certain examples are described herein, these examples are presented by way of example only, and are not intended to limit the scope of protection. The apparatuses and systems described herein may be embodied in a variety of other forms. Furthermore, various omissions, substitutions, and changes in the form of the example methods and systems described herein may be made without departing from the scope of protection.

Systems are provided for connecting distributed energy resource (DER) devices with metering devices. Currently there is no standard system for connecting DER devices to the grid. Existing systems often rely on coordination between a utility that owns a utility metering device and an electrician installing the DER device. For example, the utility may be required to remove the utility metering device while the electrician is on premises to install the DER device. Upon installation of the DER device, the utility has to reinstall the utility metering device.

A DER meter is described herein that provides a mechanism to meter electricity originating from both a DER device and the utility. The DER meter may mate with a DER-enabled meter socket at a customer premises. For the purpose of this disclosure, a DER device is defined as any resource on an electric distribution system (i.e., a grid) that produces or stores electricity that can be provided to the distribution system, or any large load device that can be controlled to manage overall peak load of the distribution system. For example, the DER device may be a residential solar installation or a residential wind turbine installation, with or without local battery storage.

Figure 1:
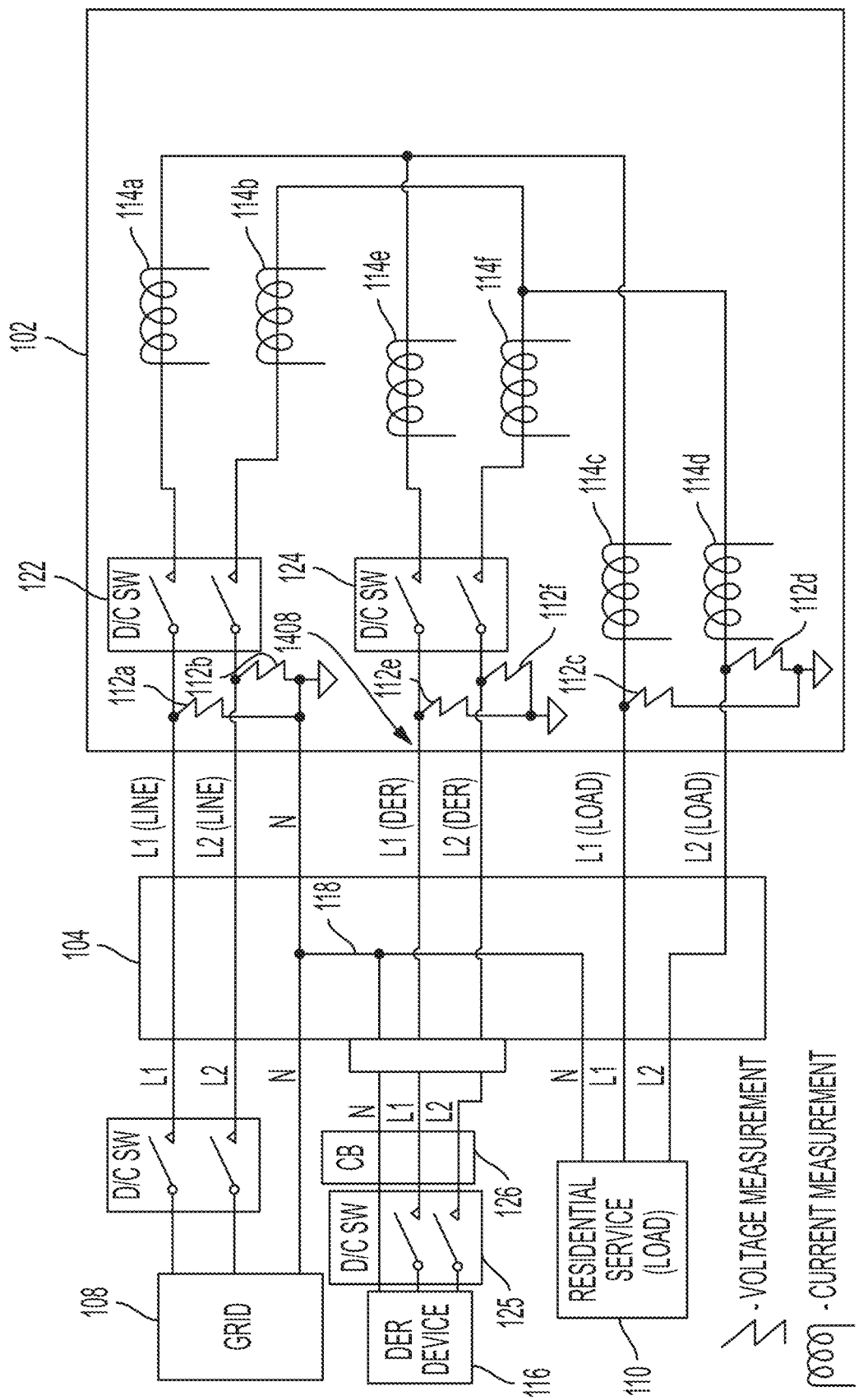
FIG. 1 is a block diagram illustrating electrical connections between a distributed energy resource (DER) meter and a meter socket in accordance with various aspects of the present disclosure.

FIG. 1 is a block diagram 100 illustrating electrical connections between a distributed energy resource (DER) meter 102 and a meter socket 104 in accordance with various aspects of the present disclosure. The DER meter 102 and the meter socket 104 are located at a customer premises (e.g., a residential building, a commercial building, etc.). The DER meter 102 measures and controls electricity delivered to the customer premises via an electric distribution system (i.e., a grid 108) and electricity generated or otherwise stored at the customer premises via a DER device (i.e., a DER device 116). Accordingly, the DER meter 102 includes sufficient connection points to receive electricity provided from the grid 108, to receive electricity provided from the DER device 116, and to provide electricity to an electrical service 110.

The DER meter 102 may be combined with a communications module to enable the DER meter 102 to communicate with other meters and with a utility. As illustrated in FIG. 1, power from the grid 108 (i.e., the electric distribution system) is supplied to the meter socket 104 through electrical wiring L1 (Line) and L2 (Line). Electrical wiring L1 (Line) and L2 (Line) may provide power from two phases of the grid 108. A neutral wire N, sometimes referred to as ground, is connected between the grid 108, the electrical service 110, and the DER device 116, for example, at an electrical service panel at a residential or commercial customer premises.

The electrical service or load 110 is also connected to the meter socket 104 via corresponding electrical wiring L1 (Load) and L2 (Load). The meter socket 104 may be a socket, such as a form 14S, 15S, or 16S meter socket, that includes electrical connectors to provide electrical connections to a conventional meter when a conventional meter is plugged into the meter socket 104. Other meter socket forms for the meter socket 104 are also contemplated. An electrical connection between the grid 108 and the electrical service 110 is formed through the DER meter 102 when the DER meter 102 is plugged into the meter socket 104. Within the DER meter 102, voltage and current provided by the grid 108 to the electrical service 110 is measured, or metered, by measuring devices. The measuring devices may be, for example, voltage transducers 112 and current transducers 114 that measure electrical characteristics of voltage and current waveforms, respectively. Power delivered to the electrical service 110 may be calculated based on the voltage and current measurements.

Output wirings from the DER device 116 may also be connected at connection points within the meter socket 104. A neutral wire N connection 118 may be formed at a connection point within the meter socket 104 to connect the neutral wires from the grid 108, the DER device 116, electrical service 110, and the DER meter 102. In one or more examples, the connection points for the DER device 116 may be positioned on a side 120 of the meter socket 104. For example, the side 120 of the meter socket 104 may be any side of the meter socket 104 that does not interface with the DER meter 102 (e.g., a side that is exposed while the meter socket 104 is coupled to the DER meter 102). Positioning the connection points on the side 120 may provide an easily accessible location for the DER device 116 to connect with the meter socket 104.

The connection points within the meter socket 104 may provide electrical connections between the meter socket 104 and the DER meter 102. For example, the connection points for the lines L1 (Line) and L2 (Line) at the meter socket 104 from the grid 108 may electrically connect the lines L1 (Line) and L2 (Line) from the grid 108 to the DER meter 102. Similarly, the lines L1 and L2 from the DER device 116 and the lines L1 (Load) and L2 (Load) to the electrical service 110 may be electrically connected to the DER meter 102 through the connection points within the meter socket 104. Similar to the lines L1 (Line) and L2 (Line) from the grid 108, the lines L1 and L2 from the DER device 116 may provide voltages having different electrical phases. Further, the connection point for the neutral wire N may also have an electrical connection in a corresponding receptacle of the meter socket 104.

The connection points (e.g., receptacles) included in the meter socket 104 may accommodate insertion of connecting components (e.g., blade connectors) on the DER meter 102 to form electrical connections between the meter socket 104 and the DER meter 102. Other electrical couplings are also contemplated between the meter socket 104, the DER device 116, and the DER meter 102. When the connecting components of the DER meter 102 are inserted into the receptacles of the meter socket 104, electrical connections may be formed between the DER meter 102 and the lines L1 (Line) and L2 (Line) from the grid 108, between the DER meter 102 and the lines L1 and L2 from the DER device 116, and between the DER meter 102 and the lines L1 (Load) and L2 (Load) to the electrical service 110. The connection points and connecting components (e.g., receptacles and blade connectors) may generally be referred to as mating connectors.

When the connecting components of the DER meter 102 are inserted into the receptacles of the meter socket 104, and when the connecting components of the DER device 116, the grid 108, and the electrical service 110 are inserted into the receptacles of the meter socket 104, an electrical connection may be formed between the neutral wire N and the DER meter 102. The electrical connection of the neutral wire N with the DER meter 102 may provide an electrical reference point to enable voltage measurements from L1 (Line) to neutral and L2 (Line) to neutral at the voltage transducers 112 within the DER meter 102. The ability to perform these voltage measurements at the DER meter 102 may allow for more advanced and higher fidelity metering than is possible with a standard 2S meter form, for example, which only has L1 (Line) and L2 (Line) connections available (i.e., no neutral N connection) and therefore can only measure line to line voltage (i.e., from L1 (Line) to L2 (Line)). The DER meter 102 may also perform current measurements on the L1 (Line) and L2 (Line) lines from the grid 108 using the current transducer 114a and 114b, the electrical service 110 using the current transducers 114c and 114d, and the DER device 116 using the current transducers 114d and 114e. The ability to perform L1 (Line) to neutral and L2 (Line) to neutral voltage measurements at the DER meter 102 as well as performing the current measurements at the DER meter 102 may enable implementation of various applications such as load disaggregation algorithms.

In an example, the current transducers 114c and 114d may not be included in the DER meter 102. In such an example, the current to the electrical service 110 (e.g., the load) may be measured using an algebraic sum of currents from the grid 108 and the DER device 116. The following equations may be used:

$$I_{LOAD-L1} = -I_{LINE-L1} - I_{DER-L1} \quad \text{(Equation 1)}$$

$$I_{LOAD-L2} = -I_{LINE-L2} - I_{DER-L2} \quad \text{(Equation 2)}$$

where $I_{LOAD-L1}$ is a calculated current at L1 (Load), $I_{LINE-L1}$ is a measured current at L1 (Line), $I_{DER-L1}$ is a measured current at L1 (DER), $I_{LOAD-L2}$ is a calculated current at L2 (Load), $I_{LINE-L2}$ is a measured current at L2 (Line), and $I_{DER-L2}$ is a measured current at L2 (DER).

The lines L1 (Line) and L2 (Line) from the grid 108 may provide line voltages having different electrical phases. The different electrical phases may be generated by a local distribution transformer (e.g., a pole-mounted transformer located near the meter) or may be different electrical phases generated at a substation. Similarly, the lines L1 and L2 from the DER device 116 may provide line voltages having different electrical phases. The electrical phases of the line voltages on the lines L1 and L2 provided by the DER device 116 may be synchronized with the electrical phases of the line voltages on the lines L1 (Line) and L2 (Line) provided by the grid 108.

Embodiments of meter sockets and meters in accordance with the present disclosure may include more or fewer connection points or receptacles corresponding to different phases of line voltages. For example, when only one line voltage phase is connected (e.g., phase A) fewer connection points and receptacles may be included in the meter socket since connection points for additional phases (e.g., phase B and phase C) are not needed. Similarly, when three line voltage phases are connected (e.g., phases A, B, and C) additional connection points and receptacles may be included in the meter socket.

In an example, a disconnect switch 122 is included in the DER meter 102. In such an example, the disconnect switch 122 may remain open when the voltage transducers 112a and 112b do not detect a voltage from the grid 108. Further, the disconnect switch may be used as a mechanism to synchronize voltage phases from the DER device 116 with the grid 108. For example, the voltage transducers 112c and 112d may measure the voltage supplied by the DER device 116 while the voltage transducers 112a and 112b measure the voltage supplied by the grid 108 while the disconnect switch 122 is open. Upon reaching synchronization between the DER device 116 and the grid 108 during a synchronization operation, the disconnect switch 122 may close. Further, the disconnect switch 122 may disconnect the DER meter 102 from the L1 (Line) and L2 (Line) connections to the grid 108. The ability to disconnect the DER meter 102 from the grid 108 may enable "islanding," which involves disconnecting the DER meter 102 from the grid 108 and supplying power to the electrical service 110 only from the DER device 116.

The DER meter 102 may also include an integrated, controllable electrical disconnect switch 124 that disconnects or protects the DER device 116. In some example, a disconnect switch 125 between the DER device 116 and the socket 104 may also be included to disconnect or protect the DER device 116. Additionally, a circuit breaker 126 may be positioned between the DER device 116 and the socket 104 or within the DER meter 102. In an example, a single device may perform both functions of a circuit breaker and a separate electrical disconnect device to disconnect the lines L1 and L2 of the DER device 116 from the DER meter 102. In an example, the circuit breaker 126 may disconnect the DER device 116 from the DER meter 102 upon occurrence of an electrical fault. The circuit breaker 126 may be integrated into the DER meter 102. Additionally, the circuit breaker 126 may be controlled locally or remotely.

The controllable electrical disconnect switch 124 may be controlled by a processor (not shown) and a communications module (not shown) of the DER meter 102. The controllable electrical disconnect switch 124 may operate automatically to disconnect the DER device 116 from the grid 108, for example, when a high load is detected at voltage transducers 112e and 112f or when the electrical service or load 110 is disconnected from the meter. In some examples, the controllable electrical disconnect switch 124 may operate automatically to disconnect the DER device 116 from the grid 108 based on a command received from the DER meter 102 or another device.

The controllable electrical disconnect switch 124 may connect or disconnect the DER device 116 with the DER meter 102. In connecting the DER device 116 to the DER meter 102, the DER meter 102 may measure power production or consumption of the DER device 116 as a separate value to the energy consumed from or sent back to the electric distribution system (i.e., the grid 108) thereby providing billable data. The billable data (i.e., consumption from the grid 108 or production fed back to the grid 108) may be metered within the electricity meter using "net metering" or similar methods. Further, the controllable electrical disconnect switch 124 may connect or disconnect the DER device 116 from the grid 108 based on power production or consumption requirements of the grid 108 and the DER device 116. Moreover, the disconnect switch 124 may be used to electrically disconnect the DER device 116 from the DER meter 102 to enable a technician to repair the DER meter 102, install the DER meter 102, or to replace the DER meter 102.

In an example, the DER disconnect switch (i.e., the controllable electrical disconnect switch 124) and the line disconnect switch (i.e., the disconnect switch 122) may be implemented with a 4-position switch. The 4-position switch may enable the following: 1. connection of the grid 108, the DER device 116, and the electrical service (load) 110; 2. connection of the grid 108 and the electrical service 110, with the DER device 116 disconnected; 3. connection of the electrical service 110 and the DER device 116, with the grid 108 disconnected; and 4. disconnection of the grid 108, the DER device 116, and the electrical service 110. Advantages of using a 4-position switch instead of two 2-position switches include reducing the cost and size of the components needed to provide the switching functions.

The DER meter 102 may measure and control the electricity delivered to the electrical service 110 via the grid 108, the DER device 116, or both. The DER meter 102 may include a communications module (not shown) and a processor (not shown). The processor may be a microprocessor; however, embodiments in accordance with the present disclosure are not limited to such an implementation. For example, the processor may be a microprocessor, microcomputer, computer, microcontroller, programmable controller, or other programmable device. One of ordinary skill in the art will appreciate that other variations may be implemented without departing from the scope of the present disclosure.

The communications module may communicate via RF, cellular, PLC, or any other suitable communications technology. The communications module may receive communications via a network that include instructions for controlling the controllable electrical disconnect switch 124. The communications module may transmit information related to the operation of the meter and the measurements performed by the measurement devices in the meter to other devices on the network or to a central system. The communications module may also provide communication between the DER meter 102 and the DER device 116.

In accordance with various aspects of the present disclosure, where the DER device 116 includes some form of electricity generator (e.g., solar or wind electricity generation) or a storage device, the DER meter 102 may use information about the electric distribution system. The information may include real-time electricity pricing or other information to make decisions and to control the DER device 116. For example, the DER meter 102 may use information to determine whether the DER device 116 should send energy to the grid 108 (e.g., from solar or battery storage, where battery storage could include batteries within an electric vehicle or similar), whether the DER device 116 should consume energy from the grid 108 (e.g., to charge storage or allow large loads such as water heaters, pool pumps, etc. to run), whether the DER device 116 should disconnect from the grid 108 (e.g., not consume energy from the grid 108 or send energy to the grid 108), or any combination thereof. Appropriate control actions may be initiated by the DER meter 102 based on the determination. One or ordinary skill in the art will appreciate that the above examples of decisions and control are not exhaustive and that other decisions and control operations may be performed without departing from the scope of the present disclosure.

Figure 2:
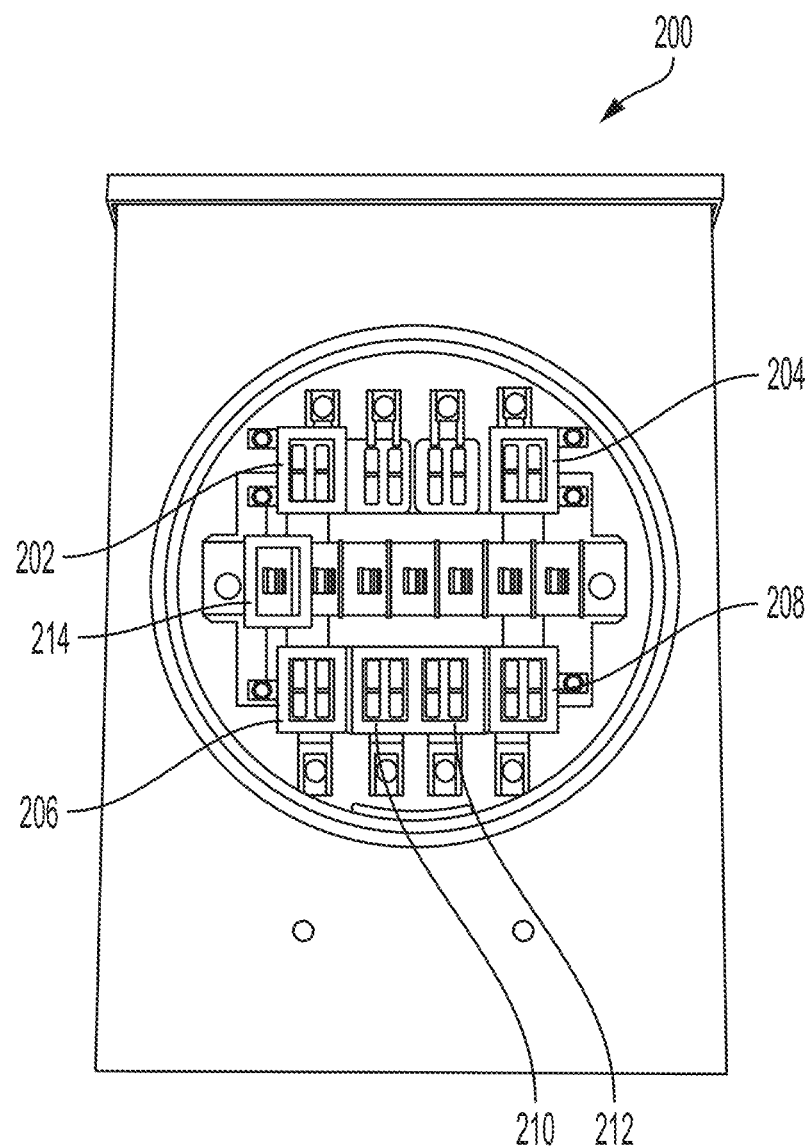
FIG. 2 is a front view of an example of a 15-terminal meter socket in accordance with various aspects of the present disclosure.

FIG. 2 is a front view of an example of a 15-terminal meter socket 200 in accordance with various aspects of the present disclosure. The illustrated meter socket 200 is a 16S meter socket. The meter socket 104, as depicted in FIG. 1, may be the 15-terminal meter socket 200. In an example, the 15-terminal meter socket 200 may be arranged to house multiple meter forms. For example, terminals 202 and 204 may be lines for the L1 (Line) and L2 (Line) described in FIG. 1 and electrically coupled to the grid 108. Terminals 206 and 208 may be lines for the L1 (Load) and the L2 (Load) described in FIG. 1 and electrically coupled to the electrical service 110. Terminals 210 and 212 may be lines for the L1 (DER) and the L2 (DER) described in FIG. 1 and electrically coupled to the DER device 116. In an example, terminal 214 may be electrically coupled to the neutral wire N described in FIG. 1.

Figure 3:
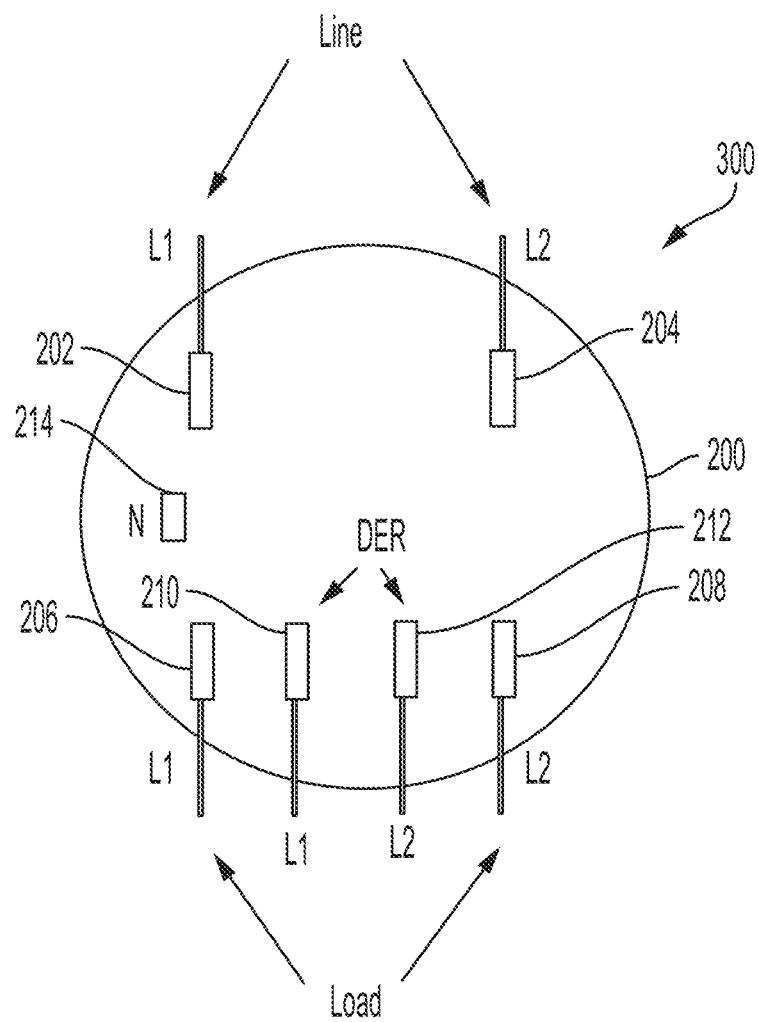
FIG. 3 is a diagram of terminals of the 15-terminal meter socket of FIG. 2 in accordance with various aspects of the present disclosure.

FIG. 3 is a diagram 300 of the terminals 202-214 of the 15-terminal meter socket 200 in accordance with various aspects of the present disclosure. The diagram 300 depicts how the terminals 202-214 of the meter socket 200 (e.g., a 16S meter socket) may be electrically coupled to the line (i.e., the grid 108), the load (i.e., the electrical service 110), the neutral wire N, and, once installed, the DER device 116.

Figure 4:
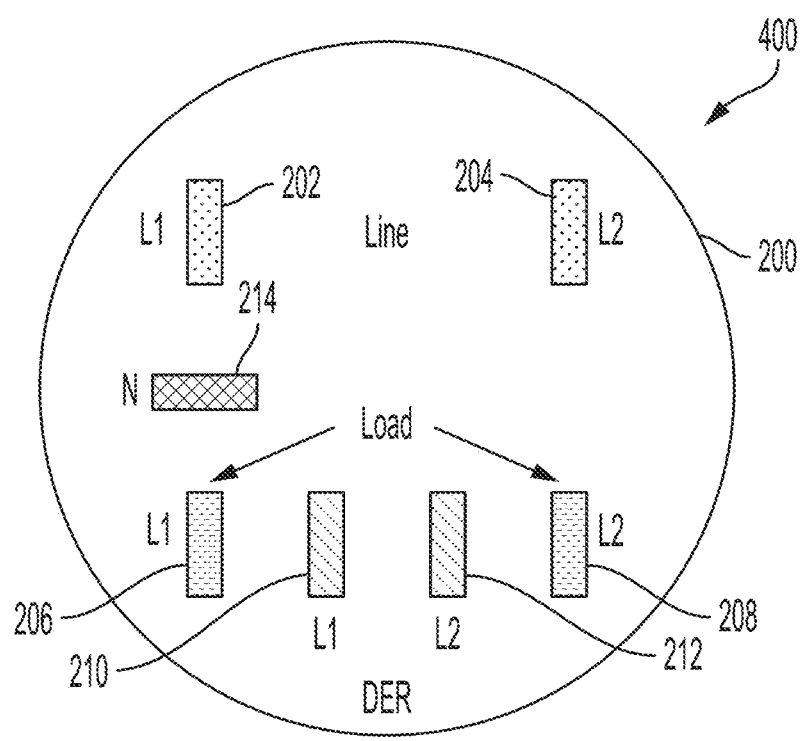
FIG. 4 is a diagram of a possible alternative configuration for a neutral terminal of the meter socket of FIG. 2 in accordance with various aspects of the present disclosure.

FIG. 4 is a diagram 400 of a possible alternative configuration for the neutral terminal 214 of the meter socket 200 in accordance with various aspects of the present disclosure. Other arrangements are also possible, including arrangements that vary which terminals 202-214 are used for the line, the load, the neutral wire N, and the DER device 116. By providing alternative arrangements of the neutral wire N in the meter sockets 200 of FIGS. 3 and 4, the meter socket 200 may be incompatible with metering devices with an incompatible arrangement of connection blades. That is, a metering device, such as the DER meter 102, would need to be appropriately keyed to one of the meter sockets 200 in FIG. 3 or 4 or any other arrangement of the meter socket 200.

Figure 5:
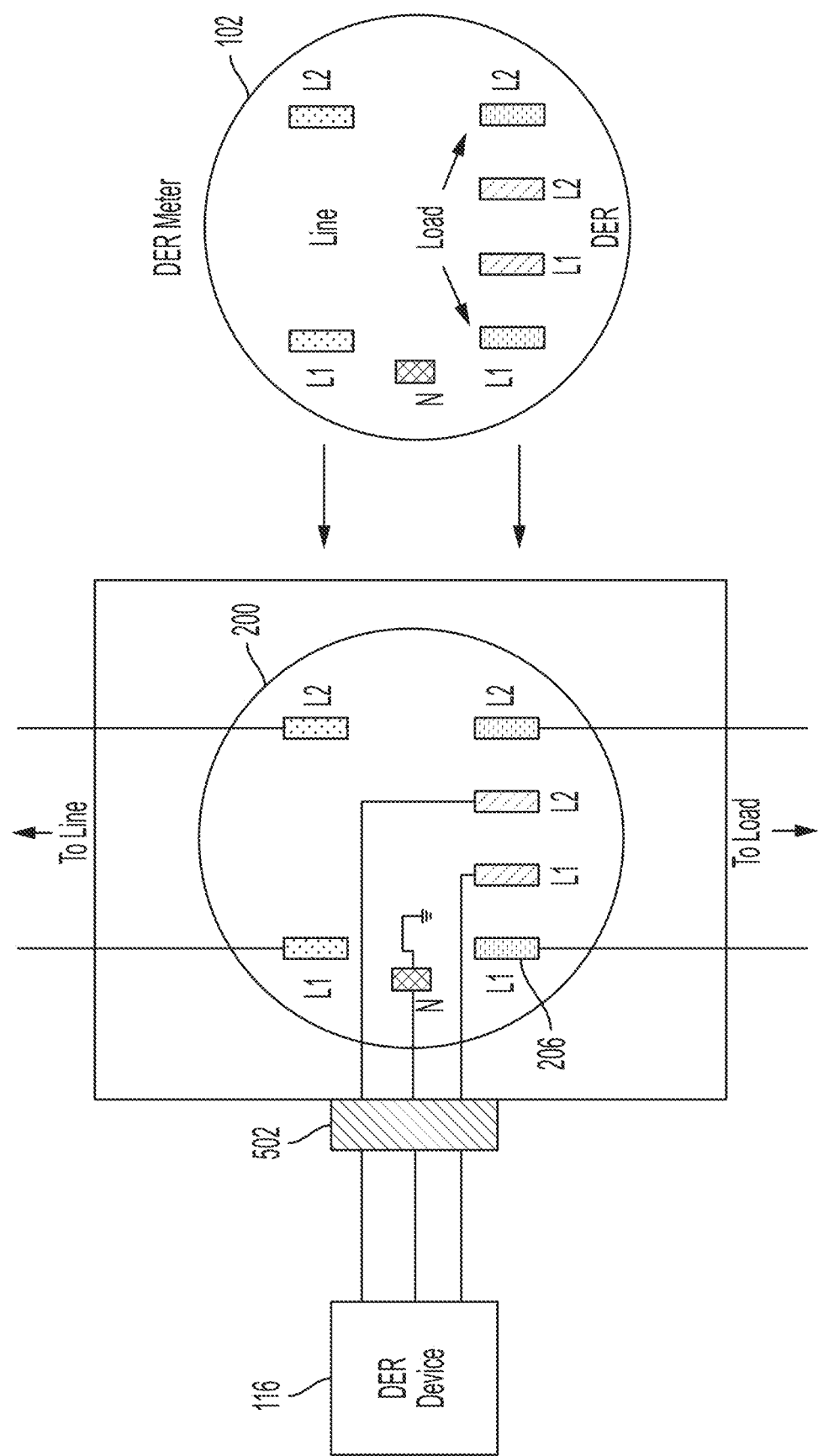
FIG. 5 is an example of a DER meter being installed in the meter socket of FIG. 2 in accordance with various aspects of the present disclosure.

FIG. 5 is an example of the DER meter 102 being installed in the DER-enabled meter socket 200 in accordance with various aspects of the present disclosure. In an example, the meter socket 200 includes an optional DER connector 502 on the side 120 of the meter socket 200 in accordance with various aspects of the present disclosure. The DER connector 502 may be added to the meter socket 200 to facilitate the quick and efficient connection of a DER device 116. The DER connector 502 may be integrated into the meter socket 200 or may be an optional add-on component.

To install the DER device 116 at a premises with existing service, an electrician connects the DER device 116 to the DER connector 502, and the utility replaces a traditional meter with the DER meter 102. The DER meter 102 is also referred to herein as a multi-port meter. The DER connector 502 and the meter socket 200 allow these steps to occur independently. The electrician and the utility do not need to coordinate in such an instance. The electrician may connect the DER device 116 to the DER connector before or after the utility replaces the traditional meter.

Figure 6:
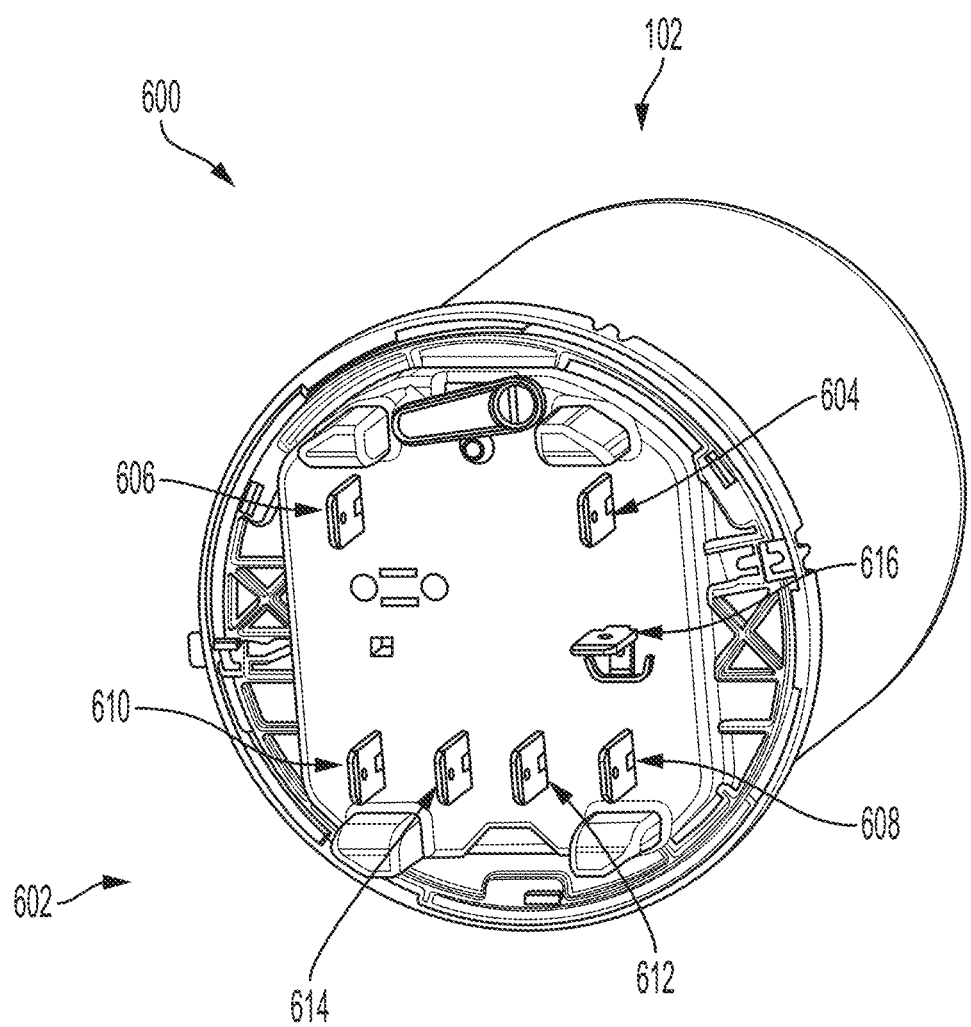
FIG. 6 is a perspective view of a blade portion of a DER meter in accordance with various aspects of the present disclosure.

FIG. 6 is a perspective view 600 of a blade portion 602 of the DER meter 102 in accordance with various aspects of the present disclosure. In an example, blades 604 and 606 electrically couple to L1 (Line) and L2 (Line) of the DER meter 102, respectively. Blades 608 and 610 couple to L1 (Load) and L2 (Load) of the DER meter 102, respectively. Blades 612 and 614 couple to L1 (DER) and L2 (DER) of the DER meter 102, respectively. Additionally, blade 616 couples to the neutral line N of the DER meter 102. As discussed above with respect to FIG. 4, the blades 602-614 of the DER meter 102 may be keyed to fit within the corresponding terminals 202-214 of the socket 200 of FIG. 4. Other arrangements of the blades 602-614 are also contemplated.

Figure 7:
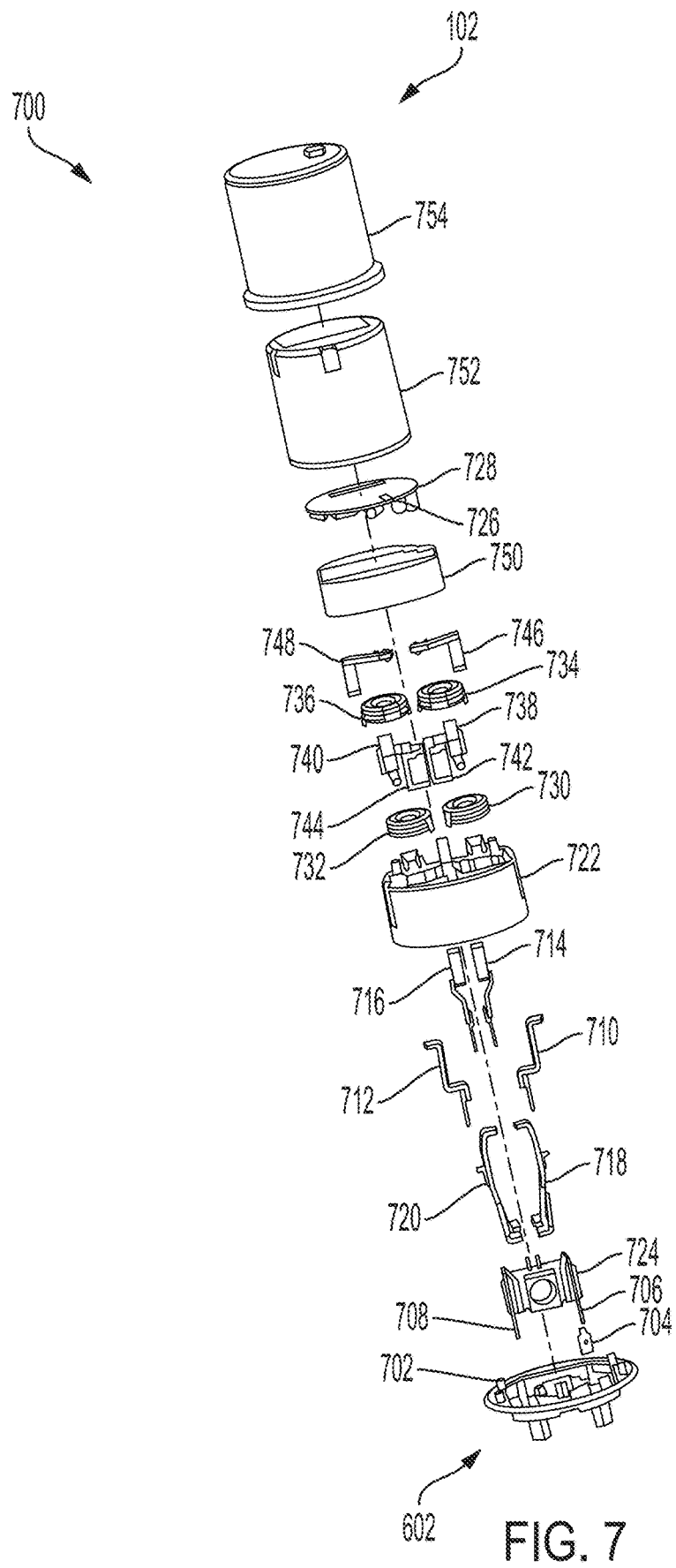
FIG. 7 is an exploded view of the DER meter of FIG. 6 in accordance with various aspects of the present disclosure.

FIG. 7 is an exploded view 700 of the DER meter 102 in accordance with various aspects of the present disclosure. The blade portion 602 of the DER meter 102 may be located on a base plate 702 and electrically couple with a neutral busbar 704, an L1 (Line) busbar 706, an L2 (Line) busbar 708, an L1 (Load) busbar 710, an L2 (Load) busbar 712, an L1 (DER) busbar 714, and an L2 (DER) busbar 716. An L1 interconnect busbar 718 may electrically interconnect the L1 busbars 706, 710, and 714, and an L2 interconnect busbar 720 may electrically interconnect the L2 busbars 708, 712, and 716.

In an example, a plastic cover 722 may fit over the busbars 704-720 and a line disconnect switch assembly 724. The line disconnect switch assembly 724 may be motor driven. That is, a motor may mechanically drive the line disconnect switch assembly 724 to an open position or a closed position. Control of the line disconnect switch assembly 724 may be provided by a controller 726 on a printed circuit board (PCB) assembly 728. In an example, the line disconnect switch assembly 724 may be the disconnect switch 122 described above with respect to FIG. 1.

An L1 (Line) current transducer 730 may be positioned around the L1 (Line) busbar 706, and an L2 (Line) current transducer 732 may be positioned around the L2 (Line) busbar 708. The L1 (Line) current transducer 730 may be used to measure the current on the L1 (Line), and the L2 (Line) current transducer 732 may be used to measure the current on the L2 (Line). In an example, the L1 (Line) current transducer 730 and the L2 (Line) current transducer 732 may be the current transducers 114a and 114b, respectively, as depicted in FIG. 1.

Similar to the L1 (Line) current transducer 730 and the L2 (Line) current transducer 732, an L1 (Load) current transducer 734 may be positioned around the L1 (Load) busbar 710, and an L2 (Load) current transducer 736 may be positioned around the L2 (Load) busbar 712. The L1 (Load) current transducer 734 may be used to measure the current on the L1 (Load), and the L2 (Load) current transducer 736 may be used to measure the current on the L2 (Load). The L1 (Load) current transducer 734 and the L2 (Load) current transducer 736 may be the current transducers 114c and 114d, respectively, as depicted in FIG. 1.

An L1 (DER) current transducer 738 may be positioned around the L1 (DER) busbar 714, and an L2 (DER) current transducer 740 may be positioned around the L2 (DER) busbar 716. The L1 (DER) current transducer 738 may be used to measure the current on the L1 (DER), and the L2 (DER) current transducer 740 may be used to measure the current on the L2 (DER). In an example, the L1 (DER) current transducer 738 and the L2 (DER) current transducer 740 may be the current transducers 114e and 114f, respectively, as depicted in FIG. 1.

Disconnect switches 742 and 744 may also be positioned along a path of the L1 (DER) busbar 714 and the L2 (DER) busbar 716, respectively. The disconnect switches 742 and 744 may be controllable electrical disconnect switches, such as the controllable electrical disconnect switch 124 of FIG. 1. In an example, the disconnect switches 742 and 744 may disconnect the DER device 116 from the DER meter 102 upon occurrence of an electrical fault. Additionally, the disconnect switches 742 and 744 may be controlled locally or remotely using the controller 726 or an additional controller on the PCB assembly 728.

An additional L1 interconnect busbar 746 may electrically interconnect the L1 components at another location, and an additional L2 interconnect busbar 748 may electrically interconnect the L2 components at another location. An isolation cover 750 may be installed between the PCB 728 and the L1 and L2 interconnect busbars 746 and 748. The isolation cover 750 isolates the electrical components of the DER meter 102 from the PCB assembly 728. Additionally, an inner cover 752 may be positioned surrounding the inner-components of the DER meter 102, and an outer cover 754 may be positioned around the inner cover 752. In an example, the inner cover 752 may be an opaque plastic, while the outer cover 754 is a transparent plastic.

Figure 8:
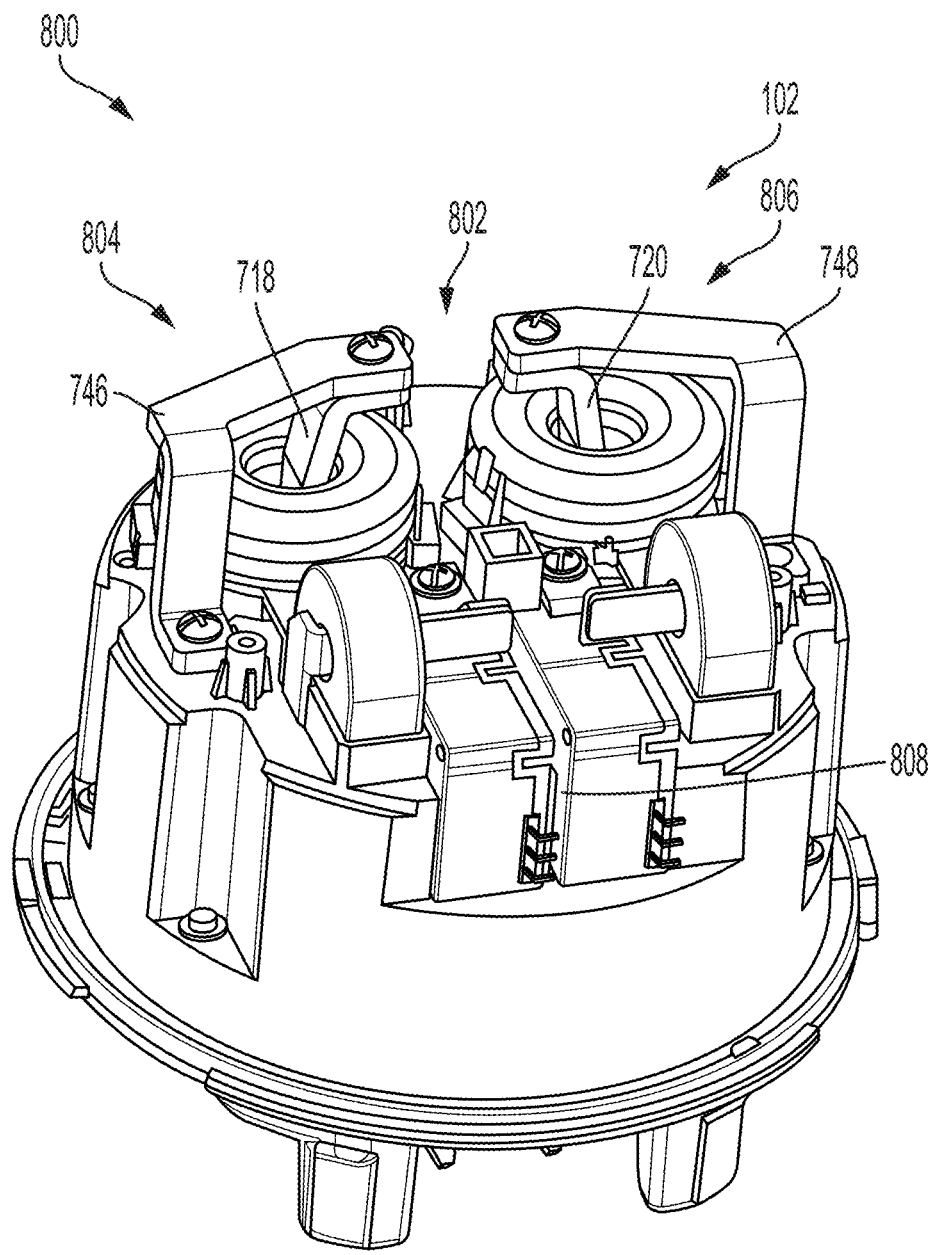
FIG. 8 is a perspective view of the DER meter of FIG. 6 with a cover and printed circuit board assembly removed in accordance with various aspects of the present disclosure.

FIG. 8 is a perspective view 800 of the DER meter 102 with the inner cover 752, the outer cover 754, and the PCB assembly 728 removed in accordance with various aspects of the present disclosure. As illustrated, an air gap 802 may be maintained between exposed (e.g., not electrically insulated) L1 components 804 and exposed L2 components 806 of the DER meter 102 to provide isolation between the L1 components 804 and the L2 components 806. In an example, the air gap 802 may be maintained at a distance greater than 12 mm. In examples where the air gap 802 is smaller than 12 mm, the air gap 802 may be supplemented by the addition of a plastic layer 808, or other physical boundary layer of electrically isolating material, to further isolate the L1 components 804 from the L2 components 806.

Figure 9:
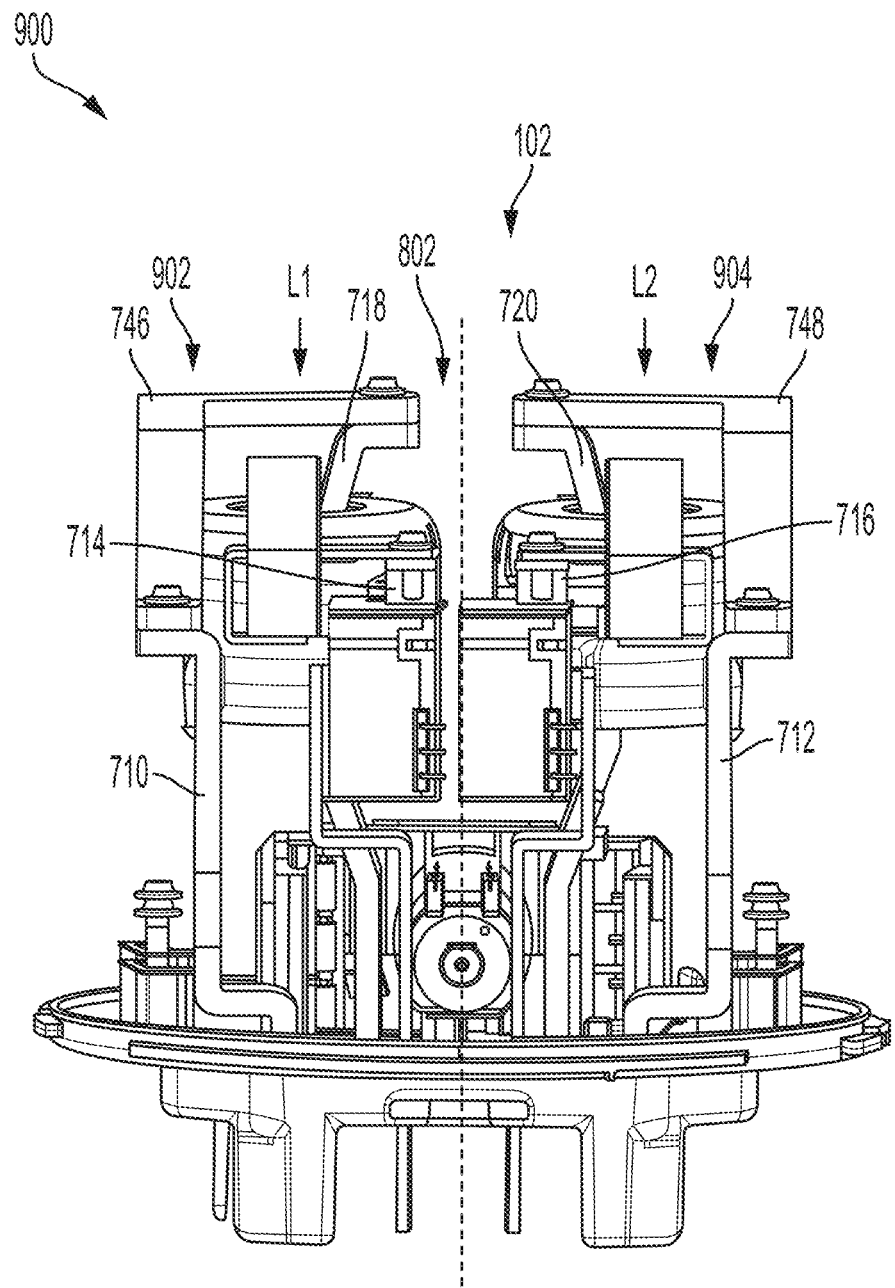
FIG. 9 is an example of a side view of the DER meter of FIG. 8 with a switch cover removed in accordance with various aspects of the present disclosure.

FIG. 9 is an example of a side view 900 of the DER meter 102 in accordance with various aspects of the present disclosure. As illustrated, the DER meter 102 includes a symmetrical design with the L1 conductors on a first side 902 and the L2 conductors on a second side 904, where the first side 902 is shown on a left side of FIG. 9, and the second side 904 is shown on a right side of FIG. 9. The air gap 802 may isolate the L1 conductors on the first side 902 from the L2 conductors on the second side 904. In an example, any exposed (i.e., not electrically insulated) conductors may be separated by the air gap 802 with at least 12 mm of space.

The DER meter 102 may support billable grade metrology on the line, load, and DER ports and provide a bi-directional metering point on each of the three ports. As used herein, the term billable grade metrology may refer to a metrology system that is capable of performing metering operations to provide measurements of the amount of energy provided by the DER device 116 to the premises or the grid 108, as well as the time when the energy is provided.

Figure 10:
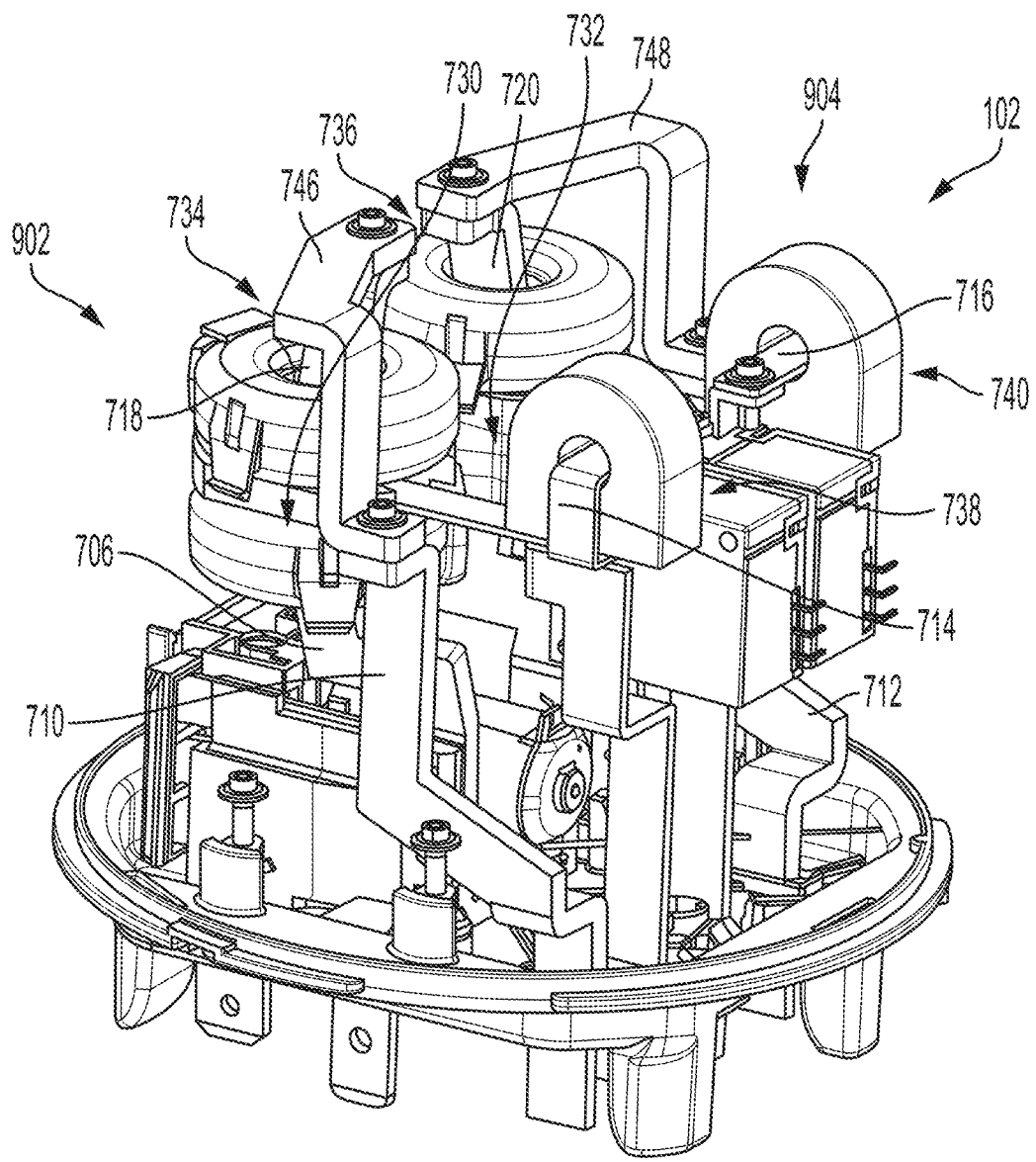
FIG. 10 is an example of a perspective view of the DER meter of FIG. 9 in accordance with various aspects of the present disclosure.

FIG. 10 is an example of a perspective view of the DER meter 102 in accordance with various aspects of the present disclosure. The L1 (Line) current transducer 730 may be positioned around the L1 (Line) busbar 706, and an L2 (Line) current transducer 732 may be positioned around the L2 (Line) busbar 708 (shown above with respect to FIG. 7). The L1 (Load) current transducer 734 may be positioned around the L1 (Load) busbar 710, and an L2 (Load) current transducer 736 may be positioned around the L2 (Load) busbar 712. Further, the L1 (DER) current transducer 738 may be positioned around the L1 (DER) busbar 714, and an L2 (DER) current transducer 740 may be positioned around the L2 (DER) busbar 716.

The L1 (Line) current transducer 730, the L1 (Load) current transducer 734, and the L1 (DER) current transducer 738 are each located on the first side 902 of the DER meter 102. As illustrated, the first side 902 of the DER meter 102 is associated with the L1 conductors. Further, the L2 (Line) current transducer 732, the L2 (Load) current transducer 736, and the L2 (DER) current transducer 740 are each located on the second side 904 of the DER meter 102. As illustrated, the second side 904 of the DER meter 102 is associated with the L2 conductors.

Figure 11:
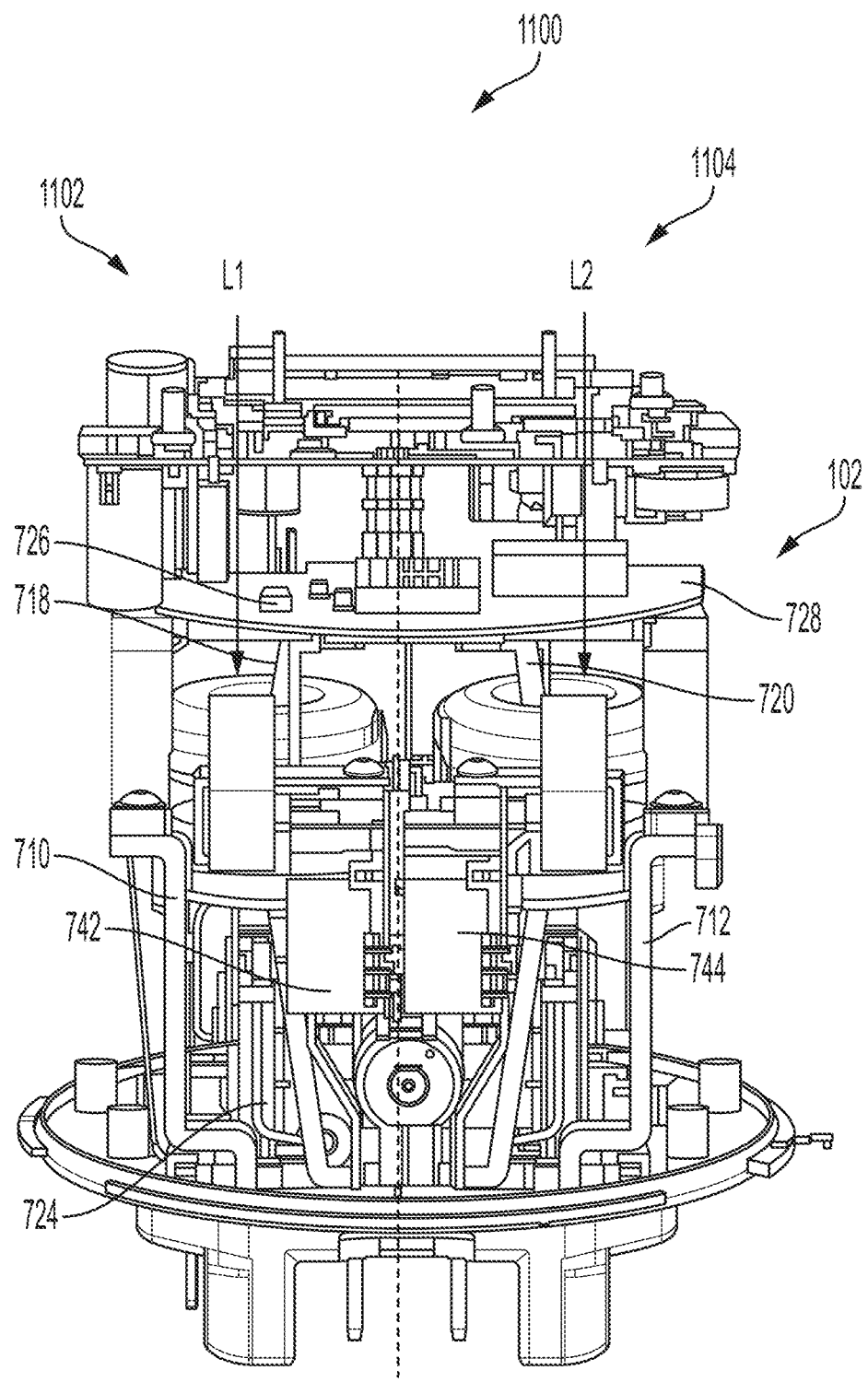
FIG. 11 is an example of a side view of the DER meter of FIG. 6 with a printed circuit board assembly and a cover removed in accordance with various aspects of the present disclosure.

FIG. 11 is an example of a side view 1100 of the DER meter 102 including the PCB assembly 728 and the covers 752 and 754 removed in accordance with various aspects of the present disclosure. As illustrated, the DER meter 102 includes a symmetrical design with the L1 conductors on a left side 1102 and the L2 conductors on a right side 1104. The DER meter 102 may support billable grade metrology on the line, load, and DER ports and provides a bi-directional metering point on each of the three ports.

In an example, the PCB assembly 728 may include the controller 726 that is able to control operation of the line disconnect switch assembly 724, the DER disconnect switch 742, the DER disconnect switch 744, or any combination thereof. The PCB assembly 728 may also include a communications module (not shown) that provides communication between the DER meter 102 and the DER device 116. In some examples, the communications module may also provide communication with a mesh network of other metering devices, with other IoT devices, or any combination thereof.

Figure 12:
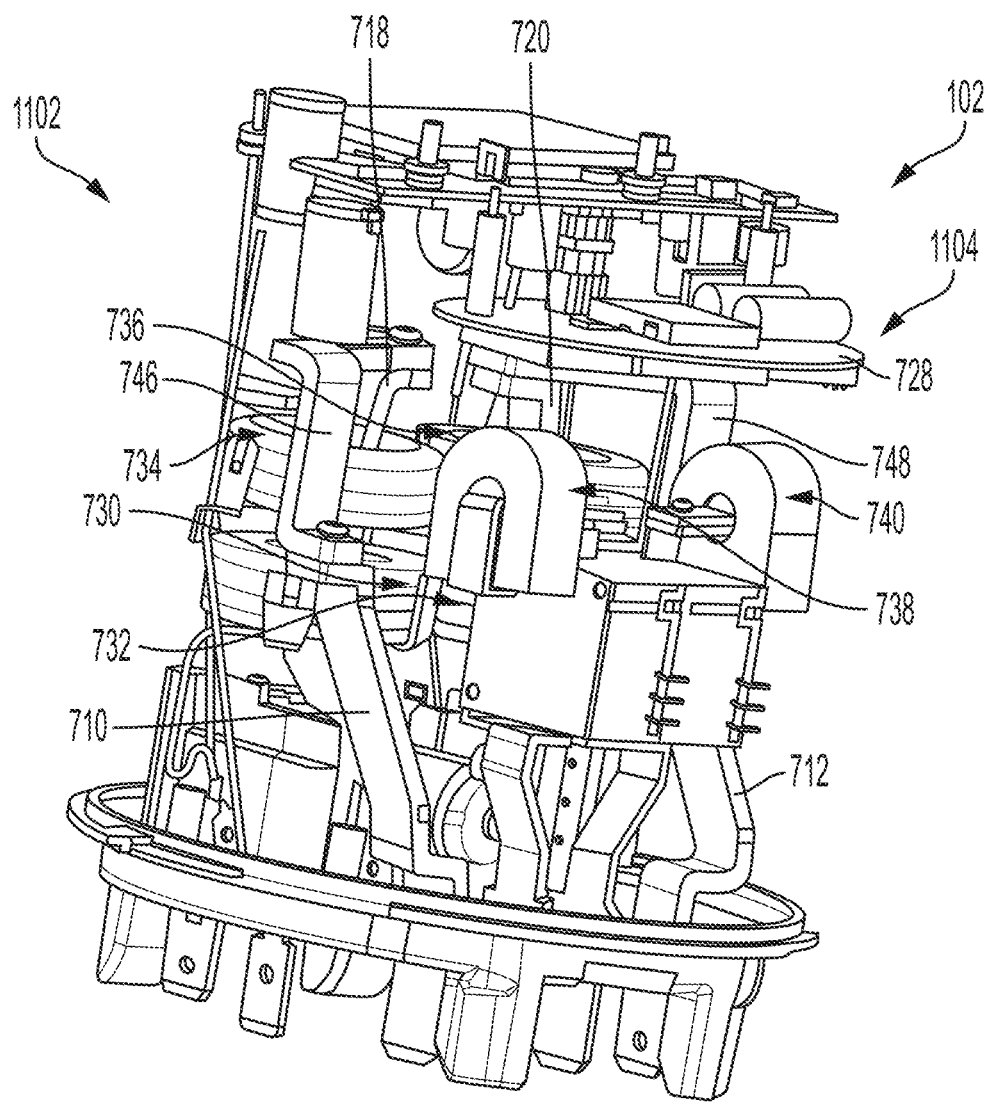
FIG. 12 is an example of a perspective view of the DER meter of FIG. 11 in accordance with various aspects of the present disclosure.

FIG. 12 is an example of a perspective view 1200 of the DER meter 102 including the PCB assembly 728 and the covers 752 and 754 removed in accordance with various aspects of the present disclosure. L1 and L2 (Load) current transducers 734 and 736, L1 and L2 (Line) current transducers 730 and 732, and L1 and L2 (DER) current transducers 738 and 740 are depicted in the DER meter 102. The L1 (Load) current transducer 734, the L1 (Line) current transducer 730, and the L1 (DER) current transducer 738 are each located on the left side 1102 of the DER meter 102. As illustrated, the left side 1102 of the DER meter 102 is associated with the L1 conductors. Further, the L2 (Load) current transducer 736, the L2 (Line) current transducer 732, and the L2 (DER) current transducer 740 are each located on the right side 1104 of the DER meter 102. As illustrated, the right side 1104 of the DER meter 102 is associated with the L2 conductors.

Figure 13:
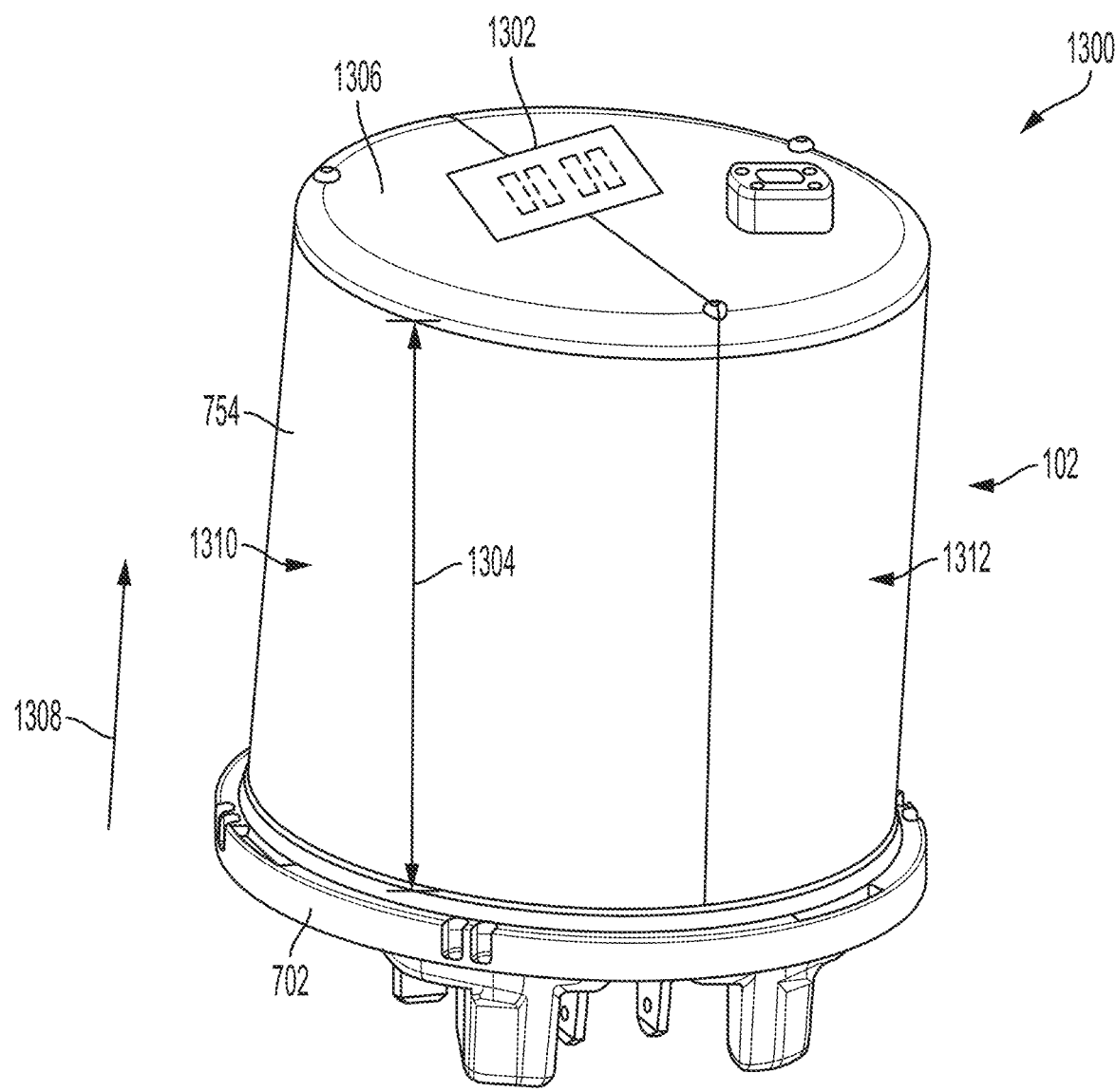
FIG. 13 is an example of a perspective view of the DER meter of FIG. 6 in accordance with various aspects of the present disclosure.

FIG. 13 is an example of a perspective view 1300 of the DER meter 102 including the outer cover 754 in accordance with various aspects of the present disclosure. The outer cover 754 may be made from a transparent, plastic material. The transparent material of the outer cover 754 may enable viewing of a display 1302. The display 1302 may visually display information about the DER meter 102. For example, the display 1302 may provide an indication of kilowatt hours consumed over a specified time period, such as a billing cycle.

In an example, a distance 1304 from the base plate 702 to an outward facing surface 1306 of the DER meter 102 may be approximately 1-inch longer than a corresponding metering device without DER metering capabilities. For example, the dimension of an ANSI form 16S meter may extend five inches from a base plate of the meter, while the DER meter 102 extends approximately six inches from the base plate 702. Further, because the DER meter 102 does not require a collar (e.g., a spacing device that supports metrology of the DER device 116) installed between the DER meter 102 and the socket 200, the distance 1304 that the DER meter 102 extends from the socket 200 may be much shorter than a distance that a combination of a collar and a standard metering device would extend from the socket 200. For example, the collar and metering device may extend three or more inches further outward in a direction 1308 from the socket 200 than the DER meter 102.

In an example, the outer cover 754, or housing, may be generally cylindrical in shape or shaped like a conical frustum (e.g., with sides sloping toward a common point away from the base plate 702). The left side 1102 of the DER meter 102 may be positioned within a first semicylinder 1310 of the outer cover 754. Similarly, the right side 1104 of the DER meter 102 may be positioned within a second semicylinder 1312 of the outer cover 754 that is different from the first semicylinder 1310.

Figure 14:
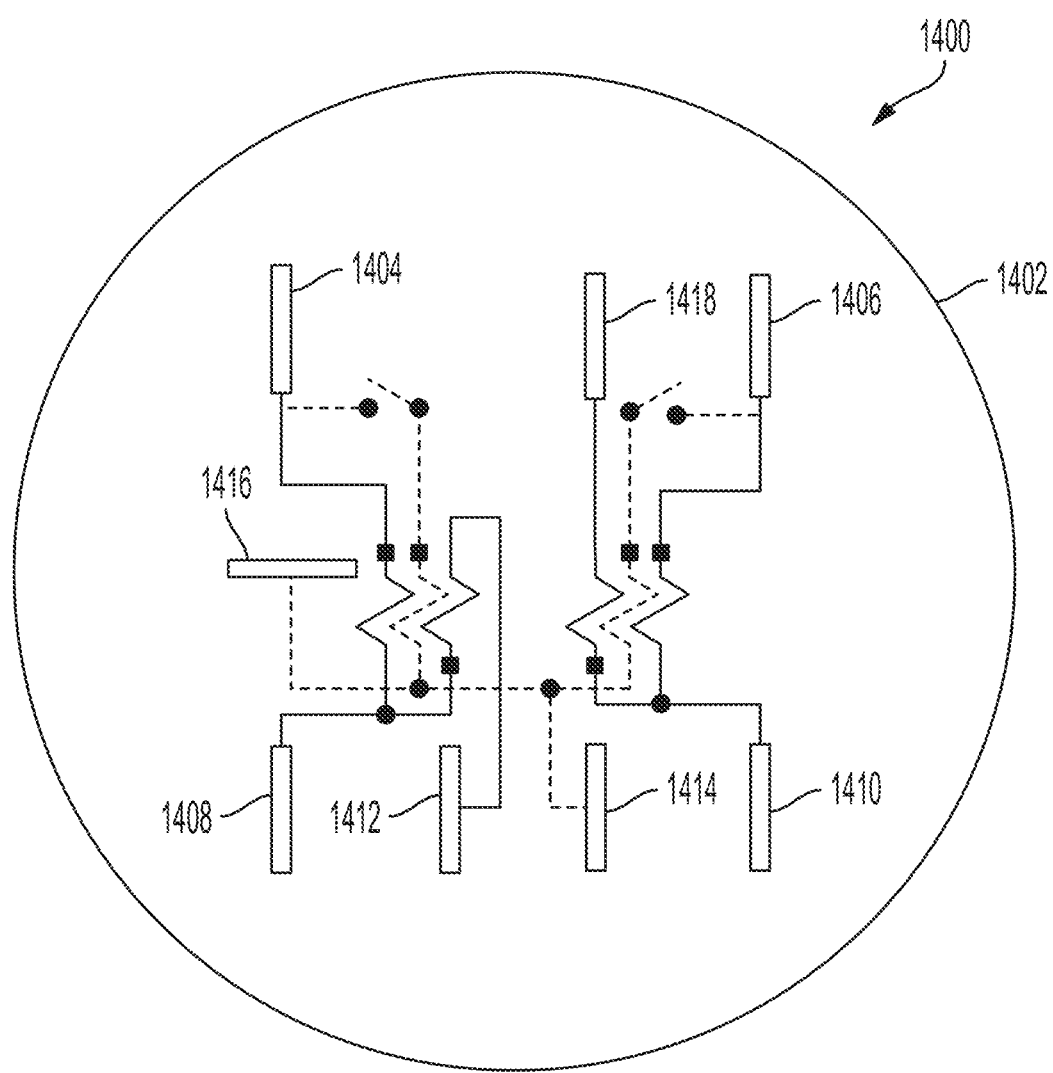
FIG. 14 is an example of a diagram of blades of the DER meter of FIG. 1 in accordance with various aspects of the present disclosure

FIG. 14 is a diagram 1400 of blades 1404-1418 of a multi-port meter 1402 (e.g., the DER meter 102) in accordance with various aspects of the present disclosure. The blades 1404-1418 may arranged in such a manner to fit with a specific DER socket 104 arrangement. In an example, the blades 1414 and 1416 may connect to the neutral wire N, while the blades 1704, 1706, 1708, 1710, 1712, and 1718 may each connect to a line associated with one of the grid 108, the DER device 116, or the electrical service 110. For example, the blade 1404 may be coupled to the L1 (Line) of FIG. 1, the blade 1406 may be coupled to the L2 (Line) of FIG. 1, the blade 1408 may be coupled to the L1 (Load) of FIG. 1, the blade 1410 may be coupled to the L2 (Load) of FIG. 1, the blade 1412 may be coupled to the L1 (DER) of FIG. 1, the blade 1414 may be coupled to a neutral wire N of FIG. 1, the blade 1416 may also be coupled to the neutral wire N of FIG. 1, and the blade 1418 may be coupled to the L2 (DER) of FIG. 1.

While the present subject matter has been described in detail with respect to specific aspects thereof, it will be appreciated that those skilled in the art, upon attaining an understanding of the foregoing, may readily produce alterations to, variations of, and equivalents to such aspects.

Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. An electric meter, comprising:
a first set of connection paths configured to couple to a meter socket and electrically coupled to a first electrical connection path between a first phase of an electric distribution power source, a first phase of a distributed energy resource device, and a first phase of a load, wherein the first electrical connection path includes first electrical metrology components; and
a second set of connection paths configured to couple to the meter socket and electrically coupled to a second electrical connection path between a second phase of the electric distribution power source, a second phase of the distributed energy resource device, and a second phase of the load, wherein the second electrical connection path includes second electrical metrology components,
wherein the first electrical metrology components and the second electrical metrology components are symmetrically arranged in the electric meter so that the first electrical metrology components are positioned on a first side of the electric meter and the second electrical metrology components are positioned on a second side of the electric meter that is non-overlapping with the first side of the electric meter.

2. The electric meter of claim 1, wherein the first electrical metrology components include at least one first component that is not electrically insulated and the second electrical metrology components include at least one second component that is not electrically insulated, and an air gap separates the at least one first component from the at least one second component.

3. The electric meter of claim 1, wherein the first electrical metrology components comprise a first set of busbars and a first set of current transducers and the second electrical metrology components comprise a second set of busbars and a second set of current transducers.

4. The electric meter of claim 1, wherein the first electrical metrology components and the second electrical metrology components are separated with an air gap, a physical boundary layer, or a combination of both.

5. The electric meter of claim 1, wherein the first electrical metrology components comprise a first set of current transducers configured to monitor current on the first phase of the electric distribution power source, the first phase of the distributed energy resource device, and the first phase of the load, and wherein the second electrical metrology components comprise a second set of current transducers configured to monitor current on the second phase of the electric distribution power source, the second phase of the distributed energy resource device, and the second phase of the load.

6. The electric meter of claim 1, wherein the first electrical metrology components include at least one first interconnect busbar that interconnects a first line busbar, a first DER busbar, and a first load busbar, and the second electrical metrology components include at least one second interconnect busbar that interconnects a second line busbar, a second DER busbar, and a second load busbar.

7. The electric meter of claim 1, further comprising a set of mating connectors, wherein each mating connector is electrically coupled to a connection path of the first set of connection paths, the second set of connection paths, or a neutral connection path.

8. The electric meter of claim 7, wherein the set of mating connectors are installable within a 14S meter socket, a 15S meter socket, or a 16S meter socket.

* * * * *